(12) United States Patent
Chen et al.

(10) Patent No.: US 10,607,671 B2
(45) Date of Patent: Mar. 31, 2020

(54) TIMING CIRCUIT FOR COMMAND PATH IN A MEMORY DEVICE

(71) Applicant: Micron Technology, Inc., Boise, ID (US)

(72) Inventors: Liang Chen, Allen, TX (US); Ming-Bo Liu, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 15/955,330

(22) Filed: Apr. 17, 2018

(65) Prior Publication Data

US 2019/0259442 A1   Aug. 22, 2019

Related U.S. Application Data

(60) Provisional application No. 62/631,760, filed on Feb. 17, 2018.

(51) Int. Cl.
| | |
|---|---|
| *G11C 7/04* | (2006.01) |
| *G11C 7/22* | (2006.01) |
| *G11C 7/10* | (2006.01) |
| *G11C 11/4076* | (2006.01) |
| *G11C 11/4093* | (2006.01) |
| *G11C 8/18* | (2006.01) |

(Continued)

(52) U.S. Cl.
CPC .............. *G11C 7/222* (2013.01); *G06F 13/18* (2013.01); *G11C 7/106* (2013.01); *G11C 7/109* (2013.01); *G11C 7/1036* (2013.01); *G11C 7/1039* (2013.01); *G11C 7/1063* (2013.01); *G11C 7/1066* (2013.01); *G11C 7/1072* (2013.01); *G11C 7/1084* (2013.01); *G11C 7/1093* (2013.01); *G11C 7/1096* (2013.01); *G11C 7/22* (2013.01); *G11C 8/10* (2013.01); *G11C 8/18* (2013.01); *G11C 11/4074* (2013.01); *G11C 11/4076* (2013.01); *G11C 11/4093* (2013.01); *G11C 11/4096* (2013.01); *H04L 25/03057* (2013.01); *H04L 25/03267* (2013.01); *G11C 2207/229* (2013.01); *G11C 2207/2272* (2013.01)

(58) Field of Classification Search
CPC .............................. G11C 11/4093; G11C 7/04
USPC ........... 365/51, 52, 63, 191, 194, 233.1, 205
See application file for complete search history.

(56) References Cited

U.S. PATENT DOCUMENTS

| | | | |
|---|---|---|---|
| 9,536,591 B1 * | 1/2017 | Kwak | .................. G11C 11/4093 |
| 2003/0231539 A1 * | 12/2003 | Lee | ........................... G11C 7/04 |
| | | | 365/205 |

(Continued)

OTHER PUBLICATIONS

Pot International Search Report & Written Opinion for PCT Application No. PCT/US2018/055374 dated Jan. 31, 2019; 13 Pages.

*Primary Examiner* — Jason Lappas
(74) *Attorney, Agent, or Firm* — Fletcher Yoder, P.C.

(57) ABSTRACT

An apparatus, such as a memory device, that includes circuits and techniques to synchronize various internal signals with an internal clock signal to ensure proper functionality of the memory device. A walk back circuit is provided to mimic propagation delays of an internal command signal, such as a write command signal, and to speed up the delayed internal command signal an amount equivalent to the propagation delays. The walk back circuit includes a mixture of delay elements provided to mimic propagation delays caused by both gate delays and routing delays.

15 Claims, 4 Drawing Sheets

(51) Int. Cl.
*G11C 8/10* (2006.01)
*G11C 11/4096* (2006.01)
*H04L 25/03* (2006.01)
*G06F 13/18* (2006.01)
*G11C 11/4074* (2006.01)

(56) References Cited

U.S. PATENT DOCUMENTS

2010/0001762 A1   1/2010   Kim
2011/0055671 A1   3/2011   Kim et al.
2013/0329503 A1   12/2013  Bringivijayaraghavan
2016/0225431 A1   8/2016   Best et al.

* cited by examiner

TIMING CIRCUIT FOR COMMAND PATH IN A MEMORY DEVICE

CROSS-REFERENCE TO RELATED APPLICATION

This application is a Non-Provisional Patent Application of U.S. Provisional Patent Application No. 62/631,760, entitled "DDR5 MEMORY DEVICE," filed Feb. 17, 2018, which is herein incorporated by reference in its entirety and for all purposes.

BACKGROUND

Embodiments described herein relate generally to the field of memory devices. More specifically, the current embodiments include one or more systems, devices, and methods for improved timing of command signals in memory devices.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In semiconductor devices such as semiconductor memory, proper operation of the memory device is based on the correct timing and synchronization of various internal command and clock signals. For example, in reading data from the memory device, internal clock signals that clock data path circuitry to provide (e.g. output) the read data should be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to the memory device, internal clock signals that clock data path circuitry to latch write data should be provided with specific timing relationships with internal write command signals to properly enable the data path circuitry to provide the latched write data for writing to the memory device. Inaccurate timing of the internal command and clock signals could result in the write command being inadvertently ignored or incorrect write data being provided to the memory device (e.g., the write data is associated with the wrong write command).

As appreciated, the higher the frequency of the clock signals in memory devices, the more challenging it may be to generate and/or synchronize correctly timed internal clock and command signals. For example, the frequency of memory clock signals can be 1 GHz or higher in certain high speed memory devices. Further complicating the matter is that multi-data rate memories may provide and receive data at a rate higher than the memory clock signal, which may represent the rate at which commands may be executed. As a result, command signals and an internal clock signal may need to be synchronized in order to maintain proper timing. An example of a multi-data rate memory is one that outputs read data at a rate twice that of the clock frequency, such as outputting data synchronized with rising and falling clock edges of the memory clock signal.

Thus, to ensure command synchronization in synchronous memory devices, certain circuits may be provided at inputs of the memory device, outputs of the memory device and internal to the memory device. Embodiments of the present disclosure may be directed to such timing circuits that may be used to ensure proper synchronization of command signals, and particularly write command signals, in high speed memory devices.

BRIEF DESCRIPTION OF DRAWINGS

Various aspects of this disclosure may better be understood upon reading the following detailed description and upon reference to the drawings in which.

DETAILED DESCRIPTION

Figure 1:
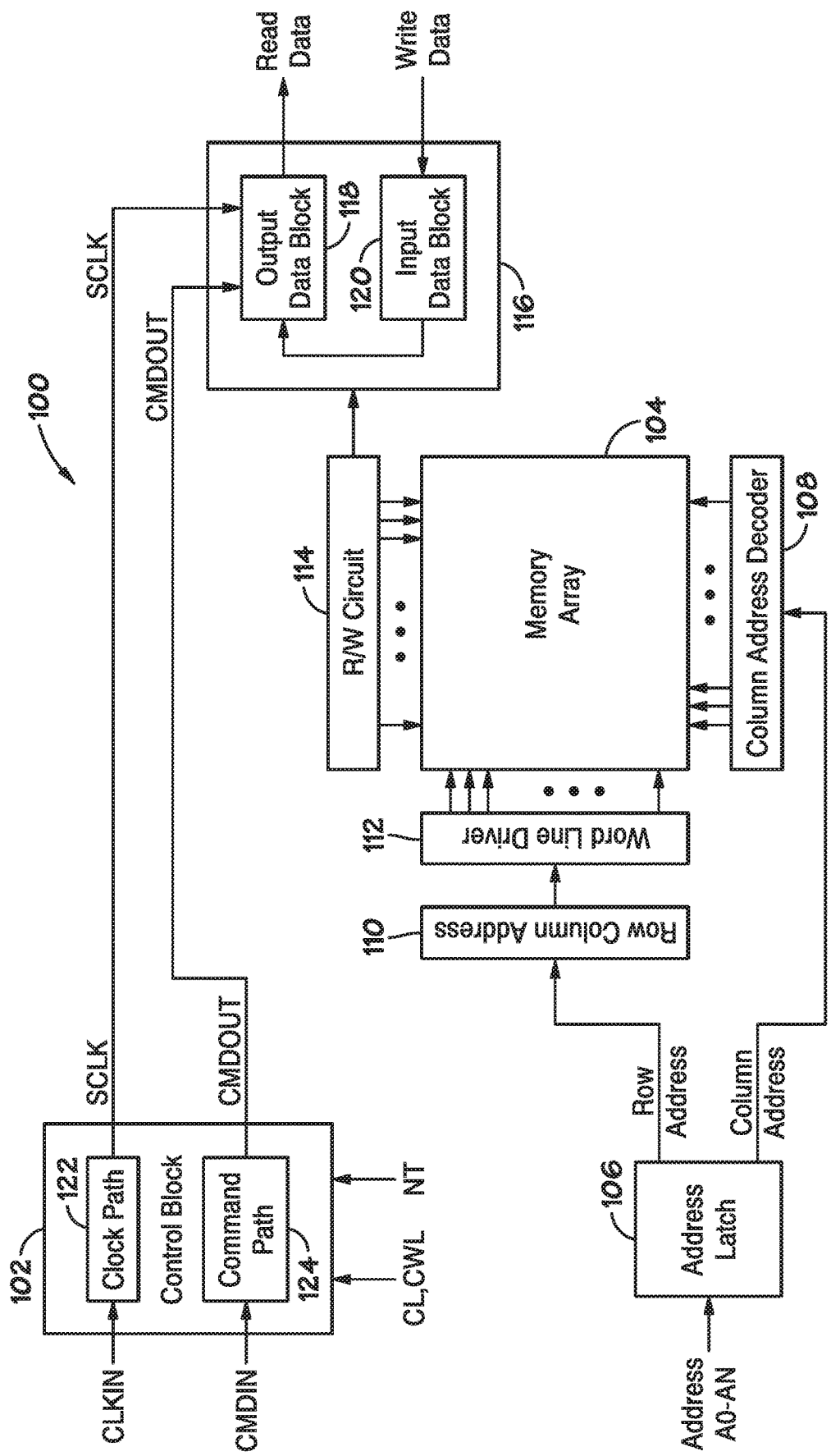
FIG. 1 is a block diagram of an apparatus including a control block, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, memory devices may employ circuits and techniques to synchronize various internal command signals with internal clock signals to ensure proper functionality of the memory device through various modes of operation. For instance, in synchronous dynamic random access memory (SDRAM), such as double data rate type four SDRAM (DDR4 SDRAM) or double data rate type five SDRAM (DDR5 SDRAM), the synchronization of command signals, such as read and write command signals, with an internal system clock signal is desirable to ensure proper operation of the memory device. More specifically, and as described in detail below, a timing circuit may be provided in the command input path of the memory device in order to synchronize internal command signals with the internal clock signals. However, because the internal command signals, such as write command signals, may inherit propagation delays on the command input path, the write command signals may be slowed down within the device. For instance, for a write command signal, propagation delays may be introduced through command decoding circuitry, clock gating, latency shifters, even/odd clock path interfacing, power saving features, long metal routing, etc. In certain systems, the clock signal is slow enough that these propagation delays do not impact the synchronization of the write command cycle with the correct clock cycle, as the propagation delays remain within tolerances that ensure that proper synchronization is maintained for each command/clock cycle. However, in some systems, such as DDR5 SDRAM devices, the system clock may be too fast to adequately ensure proper alignment of the clock and write command signals, in utilizing current designs that may not be adequate to counter the effects of propagation delays at high speeds due to tight timing margins. As used herein, propagation delays" refer to both delays caused by computational logic gates and to delays caused by routing, which may vary with pressure, voltage and temperature (PVT).

As will be appreciated, in order to synchronize a write command signal with the internal system clock signal through the timing circuit, internal write command signals may be generated. However, while the internal write command signals may inherit propagation delays, as previously described, it is desirable to ensure that the internal write command signal is sped up again, before the command signal reaches the data queue system (DQ SYS), to ensure proper synchronization in higher speed devices, such as DDR5 SDRAM devices, wherein each clock cycle (tCK) may be of an increasingly short duration as clock speeds increase. In accordance with the present embodiments, a walk back circuit may be used to speed up the internal write command to deliver a faster command signal to the DQ SYS, such that the write command signal is again synchronous with the system clock signal (SCLK). In order to re-synchronize the internal write command signal with the faster SCLK signal, the walk back circuit provides elements that mimic the propagation delays introduced to the internal write command signal through the command input path, through routing and logic gate circuits, such that the data is captured at the DQ SYS on the correct clock cycle. To account for process, voltage and temperature (PVT) variations and routing delays, the walk back circuit includes mixed type delay elements that are less susceptible to the PVT variations, in addition to gate delays that account for logic-based delays, as described further below.

Referring now to FIG. 1, a block diagram of a portion of an apparatus 100 including a control block 102, in accordance with an embodiment of the present disclosure, is illustrated. As used herein, an "apparatus" can refer to, for example, circuitry, a semiconductor die, a device, or a system. In one embodiment, the apparatus 100 may be a memory apparatus, for instance. The apparatus 100 includes a memory array 104 of memory cells, which may be, for example, dynamic random access memory (DRAM) memory cells, static random access memory (SRAM) memory cells, flash memory cells, or some other types of memory cells. In one embodiment, the memory array 104 is synchronous dynamic random access memory (SDRAM), such as double data rate type four SDRAM (DDR4 SDRAM) or double data rate type five SDRAM (DDR5 SDRAM). The apparatus 100 includes a control block 102 that receives memory commands and provides (e.g., generates) corresponding control signals within the apparatus 100 to execute various memory operations.

Row and column address signals are provided (e.g., applied) to the apparatus 100 via an address latch 106. The address latch 106 captures the received address signals, and then provides a column address and a row address to a column address decoder 108 and a row address decoder 110, respectively. The column address decoder 108 selects bit lines extending through the memory array 104 corresponding to respective column addresses. The row address decoder 110 is coupled to a word line driver 112 that activates respective rows of memory cells in the memory array 104 corresponding to received row addresses. The selected data line (e.g., a bit line or bit lines) corresponding to a received column address is coupled to a read/write circuit 114 to provide read data to an input/output (I/O) data block 116. Write data is provided to the memory array 104 through the I/O data block 116 and the read/write circuit 114. The I/O data block 116 may include an output data block 118 and an input data block 120 that operate responsive to an internal clock signal CLKOUT and an internal command signal CMDOUT, for example. The output data block 118 may provide read data from the memory array 104, responsive to a command for read operations. In some embodiments, the output data block 118 may provide the read data responsive to the internal command signal CMDOUT. The input data block 120 may receive write data responsive to a command for write operations.

The control block 102 includes a clock path 122. The clock path 122 receives an external clock signal CLKIN and propagates an internal system clock signal SCLK, which is based at least in part on the external clock signal CLKIN, to the I/O data block 116.

The control block 102 also includes a command path 124. The command path 124, which is shown in FIG. 1 as being included in the control block 102, but is not limited to such a configuration, provides the internal command signal CMDOUT to the I/O data block 116. The control block 102 responds to memory commands CMDIN to perform various operations on the memory array 104. In particular, the control block 102 is used to provide internal control signals to read data from and write data to the memory array 104. The command path 124 receives latency signals such as a CAS latency signal CL and a CAS write latency signal CWL. The command path 124 further receives a delay indication signal (NT). The command path 124 also receives internal clock signals from the clock path 122.

Figure 2:
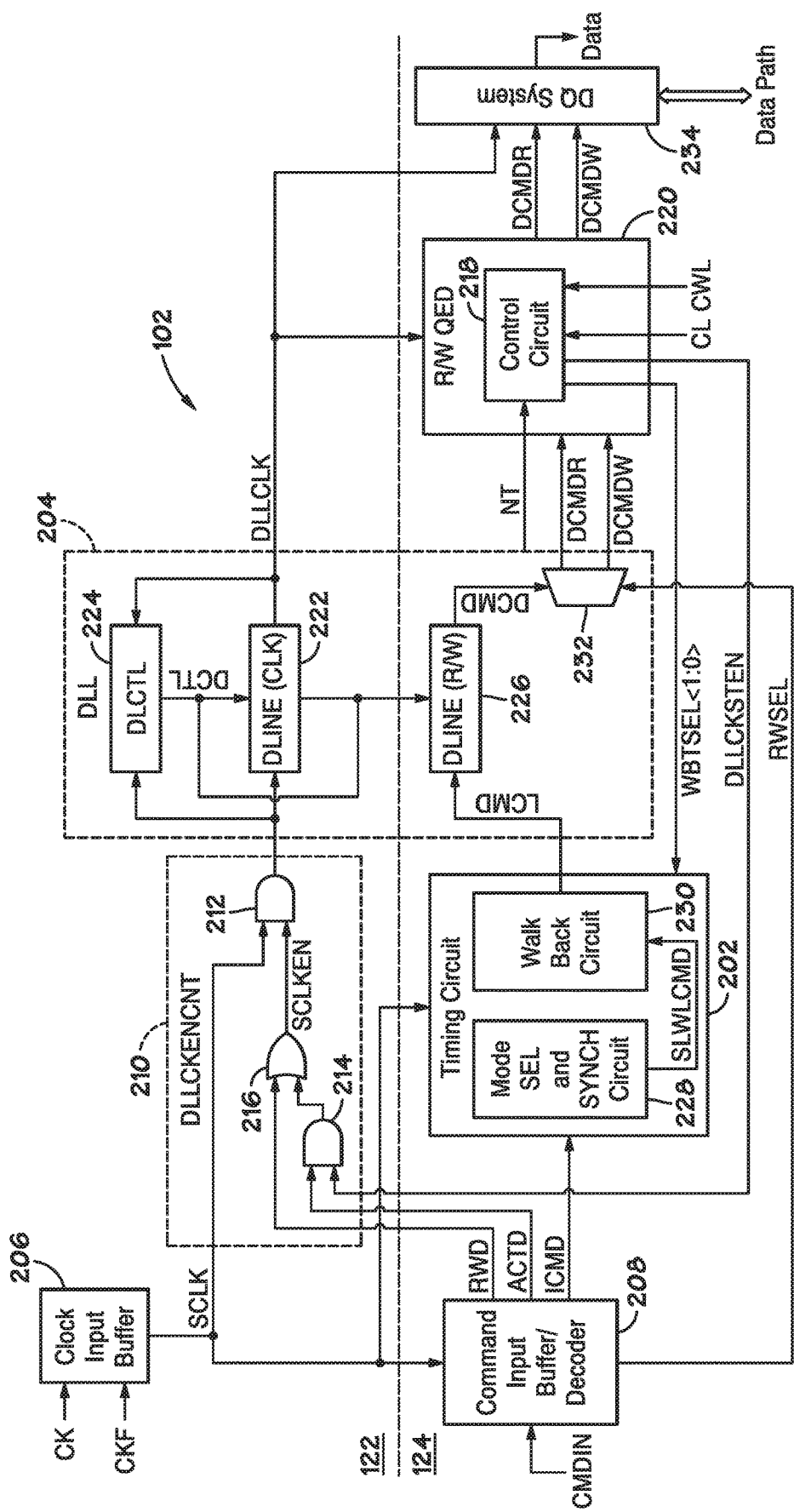
FIG. 2 is a block diagram of a control block of FIG. 1, in accordance with an embodiment of the present disclosure.

FIG. 2 is a more detailed view of portions of the control block 102 of FIG. 1, in accordance with an embodiment of the present disclosure. As previously described, the control block 102 may include the clock path 122 and the command path 124. The control block 102 may include a timing circuit 202 in the command path and a delay locked loop (DLL) circuit 204 among the clock path 122 (also referred to herein, as the "clock input path") and the command path 124 (also referred to herein as the "command input path"). The clock path 122 includes a clock input buffer 206. The clock input buffer 206 may receive a pair of complementary clock signals CK and CKF based on a clock signal CLKIN (FIG. 1), for example, and provides a system clock signal SCLK. The SCLK signal may be provided to a command input buffer/decoder circuit 208 and the timing circuit 202 on the command path 124 and a DLL clock enable control circuit (DLLCKENCNT) 210 on the clock path 122. As will be described further below, the SCLK signal is generally a fast signal with a short tCK, based on the speed of the external clock signal CK. For instance, the clock signal CK and thus the system clock signal SCLK, may have a frequency of 1 GHz or higher.

In the illustrated embodiment, the DLLCKENCNT 210 includes a first AND gate 212, a second AND gate 208 and an OR gate 216. The AND gate 212 provides the SCLK signal to the DLL 204, responsive to a system clock enable signal SCLKEN that is responsive to the CMDIN signal indicative of the read command or the write command (RWD). The AND gate 208 is supplied with an ACTD signal from the command input buffer/decoder circuit 208 and a DLLCKSTEN signal from control circuitry (CKT) 218 in the read/write dQ-Enable-Delay (R/W QED) circuit 220. The ACTD signal is set to the high level when the CMDIN signal indicative of an active (ACT) command is decoded. The DLLCKSTEN signal and the control circuitry 218 in the R/W QED 220 will be discussed in further detail below. The OR gate 216 is supplied with a RWD signal from the command input buffer/decoder circuit 208 and the output of the AND gate 208, and the output of the OR gate 216 is provided as the SCLKEN signal. The RWD signal is set to the high level when any of the read commands and write commands are decoded. Accordingly, when the DLLCK-STEN signal is at the low level, the SLCK starts to be transferred to the DLL 204 in response to the receipt of the R/W command (any of the Read and Write commands) that is issued after the issue of the ACT command. On the other hand, when the DLLCKSTEN signal is at the low level, the SLCK starts to be transferred to the DLL in response to the receipt of the ACT command that is issued before the issue of the R/W command. As will be appreciated, certain gates of the illustrated DLLCKENCNT 210 may be omitted or other gates may be added to control the enablement of the DLL circuit 204, in accordance with other embodiments. That is, the CLLCKENCNT 210 may be of any configuration that enables the DLL circuit 204 operation, responsive to the CMDIN signal. For instance, the DLLCKENCNT 210 may include only an AND gate 212 that will always enable the DLL circuit 204 operation, responsive to receipt of the R/W command, rather than also providing for operation of the DLL circuit 204 based on the ACT command under various circumstances.

The DLL circuit 204 may include a delay line (DLINE CLK) 222 and a delay control (DLCTL) circuit 224 on the clock path 122. The SCLK signal may be provided to the DLINE CLK 222 on the clock path 122 via the AND gate 212 that may provide the SCLK signal responsive to a system clock enable signal SCLKEN that is responsive to the CMDIN signal indicative of a read command or the write command. Thus, the DLL circuit 204 may be active during the read and write operations. The DLL circuit 204 may adjust the delay of the delay lines 222 and the delay line 226 (described further below, with regard to the command path 124) by changing a delay control signal DCTL responsive to the SCLK signal and a DLL clock signal when it is activated. On the other hand, the DLL circuit 204 may keep the delay of the delay lines 222 and 226 when it is deactivated. For example, the delay line 222 may be an adjustable delay line including a duty cycle controller (DCC), a coarse delay line and a fine delay line. An adjustable delay of the delay line 222 may adjust based on a delay control signal DCTL provided by the DLCTL circuit 224. The delay line 222 may provide a DLL clock signal DLLCLK having the adjustable delay relative to the SCLK signal on the clock path 122. The DLCTL circuit 224 may provide the DCTL signal to the delay line 222, responsive to the SCLK signal from the AND circuit 206 and the DLLCLK signal. The delay line 222 may further provide the DLLCLK signal to the R/W QED circuit 220 on the command path 124.

The command path 124 in the control block 102 includes the command input buffer/decoder circuit 208. The command input buffer/decoder circuit 208 may receive command signals CMDIN and the SCLK signal. The CMDIN signals may convey a memory access command, such as a read command or a write command, indicative of instructing a read operation, or a write operation, respectively. The command input buffer/decoder circuit 208 may decode the CMDIN signals, responsive to the SCLK signal. The command input buffer/decoder circuit 208 may provide an internal command signal ICMD to the timing circuit 202 and may further provide a read/write selection signal RWSEL indicative of a read operation or a write operation responsive to the CMDIN signal indicative of the read command or the write command. The ICMD signal may be a read command signal or a write command signal. The timing circuit 202 may include a CWL mode selection and synchronization circuit 228 for selecting a mode of operation and synchronizing the internal command signal ICMD with the SCLK signal. The selection and synchronization circuit 228 will be described in greater detail below with regard to FIG. 3.

The timing circuit 202 may provide a latched command signal LCMD responsive to the ICMD signal and a walk-back select WBTSEL <1:0> signal that will be described in detail below, where the timing circuit 202 may control a timing of the LCMD signal relative to the ICMD signal such that the LCMD signal is re-synchronized with the fast, undelayed SCLK signal after propagation delays have slowed the LCMD signal, relative to the ICMD signal, when a write command signal is asserted. That is, during processing through the CWL mode selection and synchronization circuit 228, the SCLK signal may be intentionally delayed to maintain proper synchronization with the ICMD signal which experiences propagation delays through long routing and through logic elements. Accordingly, the ICMD signal will be slowed such that the latched command signal that is output from the CWL mode selection and synchronization circuit 228 is a slow latched command signal SLWLCMD that is no longer synchronized with the faster, undelayed SCLK signal that is received as an input to the timing circuit 202. In accordance with embodiments of the present invention, the timing circuit 202 also includes a walk back circuit 230 which is configured to increase the speed of the slow latched command signal SLWLCMD such that it is re-synchronized with the fastest version of the system clock signal SCLK (i.e., without propagation delays), as discussed in detail below. Advantageously, by re-synchronizing the SLWLCMD signal with the SCLK signal, the LCMD signal that is output from the timing circuit 230 will be fast enough to provide for proper write data capture, even in high speed devices.

The DLL circuit 204 may further include a delay line (DLINE R/W) 214 coupled to the timing circuit 202 on the command path 124. For example, the delay line 226 may be an adjustable delay line including a DCC, a coarse delay line and a fine delay line. In some embodiments, the delay line 226 may have substantially the same circuit structure as the delay line 222 and may provide substantially the same delay as the delay line 222. An adjustable delay of the delay line 226 may adjust based on the delay control signal DCTL provided by the DLCTL circuit 224. The LCMD signal from the timing circuit 202 is transmitted to the delay line 226. The delay line 226 may provide a delayed command signal DCMD responsive to the LCMD signal and further responsive to the DCTL signal that is based on the SCLK signal and the DLLCLK signal. The DCMD signal may be transmitted to a demultiplexer 232. The demultiplexer 232 may provide either a delayed command read signal DCMDR based on the read command or a delayed command write signal DCMDW based on the write command responsive to the RWSEL signal.

The command path 124 further includes the R/W QED circuit 220. The R/W QED circuit 220 may receive a selected latency (e.g., a CL value and/or a CWL value) and an NT value. The R/W QED circuit 220 may further receive the DLLCLK signal from the delay line 222. The latency may be defined by a number of clock cycles, for example, of the SCLK signal. The NT value may be a number of clock cycles equivalent to a delay between receipt of the SCLK signal and the DLLCLK signal. The CL value is column address strobe (CAS) latency that may account for a delay time between when the apparatus 100 (FIG. 1) receives the read command and when an output buffer in a data queue system (DQ sys) circuit 234 receives read data responsive to the read command based on a clock signal (e.g., the DLLCLK signal) including time for data to be accessed and provided to an output bus (e.g., via a DQ pad in the DQ sys circuit 234). The CWL value is CAS write latency that may account for a delay time between when the apparatus 100 receives the write command and when the input data block 120 (FIG. 1) receives write data responsive to the write command based on DQS signals (not shown) including time for data to be accessed and provided to an input bus (e.g., via a DQ pad before the input data block 120). The CL value and the CWL value may be represented as numbers of clock cycles of the CLK signal. The CL value and the CWL value may be frequency dependent values, for example.

The R/W QED circuit 220 may synchronize the DCMDR signal or the DCMDW signal from the demultiplexer 232 with the DLLCLK signal from the delay line 222, for example, by adjusting a latency (e.g., shifting) of the DCMDR signal or the DCMDW signal using the NT value and the CL value or the CWL value. For example, in some embodiments, the R/W QED circuit 220 may shift the DCMDR signal for the read command responsive to the CL. In some embodiments, the R/W QED circuit 220 may shift the DCMDW signal for the write command responsive to the CWL. An adjustment factor may also be considered. For example, in some embodiments, the NT value may be greater than or equal to nine. Further, in some embodiments, the CL value and the NT value may have to satisfy the condition that a difference between the CL value and the NT value (e.g., CL−NT) is greater or equal to two. In some embodiments, the R/W QED circuit 220 shifts the DCMDR signal by (CL−(NT+2)) clock cycles of the DLLCLK signal for read commands, where two is the adjustment factor.

As previously described, the control circuit 218 of the R/W QED circuit 220 may provide a DLLCKSTEN signal to the timing circuit 202 responsive to latency information (e.g., based on a calculation of the CL value or the CWL value and the NT value). For, example, in certain embodiments, the DLLCKSTEN signal may provide for either a 3-cycle-operation (3T), a 2-cycle-operation (2T) or a 1-cycle-operation, based on calculations by the control circuit 218 using the CL, CWL and NT values that are dependent on tCK of the CK (SCLK) actually applied to the memory device and/or on the performance of the memory device caused by PVT (Process/Voltage/Temperature) variation thereof. In one embodiment, the timing circuit 202 will perform a 3T operation, a 2T operation or a 1T operation, responsive to the DLLCKSTEN signal, based on whether tCK of the CK (SCLK) is a relatively short duration (3T operation), a moderate duration (2T operation) or relatively long duration (1T operation) and in accordance with mode selection signals described further below.

In operation, the read command or the write command represented by the CMDIN signal is provided to the command path 124 and propagated through the command input buffer/decoder circuit 208 as the ICMD signal, the timing circuit 202 as the LCMD signal, the delay line 226 as the DCMD signal, the demultiplexer 232 as the DCMDR signal or the DCMDW signal, and the R/W QED circuit 220. The R/W QED circuit 220 adds clock cycles of the DLLCLK signal to the propagating command signal, either the DCMDR signal or the DCMDW signal, to provide a shifted command read signal SCMDR or a shifted command write signal SCMDW resulting in propagation delay for the command path 124 responsive to the selected latency.

The I/O data block 116 in FIG. 1 may include the DQ sys circuit 234 in FIG. 2. The DQ sys circuit 234 may receive the DLLCLK signal, the SCMDR signal and the SCMDW signal. For example, the DQ SYS circuit 234 may include a parallel-to-serial converter which converts data of a plurality of bits read in parallel from the memory array 104 in FIG. 1 via the R/W circuit 114 to a set of serial data in an appropriate order based on the timings. The DQ SYS circuit 234 may provide the data to a data queue (e.g., DQx) on a data path.

As previously described, in one embodiment, the control circuit 218 generates the DLLCKSTEN signal for the DLLCKENCNT 210 and the WBTSEL <1:0> signal for the timing circuit 202. The DLLCKSTEN signal and the 2-bit WBTSEL <1:0> signal are generated using the CL signal, the CWL signal and NT value, each provided to the control circuit 210, as previously described. In accordance with one embodiment, the control circuit 210 may bring the control block 102 of FIG. 2 into one of 6 operational modes depending on the logic levels of the DLLCKTEN signal and the WBTSEL <1:0> signal: 3T-S mode, 3T-N mode, 2T-S mode, 2T-N mode, 1T-S mode and 1T-N mode, wherein:
"S" in the respective mode indicates that the SCLK has started to transfer to the DLL in response to the receipt of the R/W commands;
"N" in the respective mode indicates that the SCLK has started to transfer to the DLL in response to the receipt of the ACT commands;
3T indicates that ICMD is synchronized with the SCLK to provide the LCMD in case of the tCK of the CK (SCLK) being a relatively short duration;
2T indicates that ICMD is synchronized with the SCLK to provide the LCMD in case of the tCK of the CK (SCLK) being a middle duration; and
1T indicates that ICMD is synchronized with the SCLK to provide the LCMD in case of the tCK of the CK (SCLK) being a relatively long duration.

In one embodiment, the logic levels of the LSB and MSB of the WBTSEL <1:0> signal are different from each other in the 1T-S and 1T-N modes of operation. The WBTSEL <1:0> signal may also determine the logic level states of enable signals (T3/T2EN and T1EN), as described further below, with regard to FIG. 3.

Figure 3:
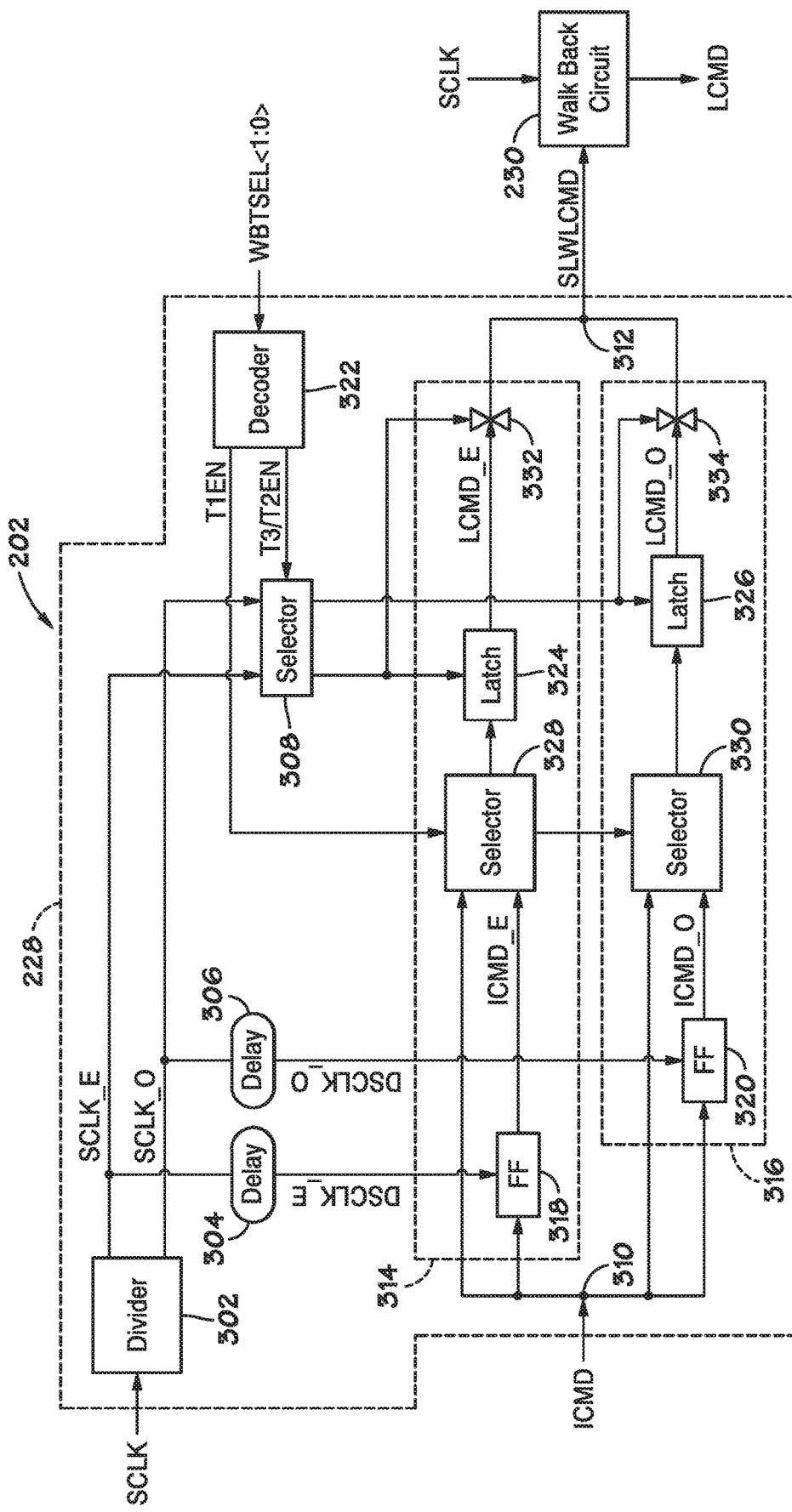
FIG. 3 is a block diagram of a portion a timing circuit of the control block of FIG. 2 for synchronizing an internal command signal, in accordance with an embodiment of the present disclosure.

FIG. 3 is a block diagram of one embodiment of the timing circuit 202, including a CWL mode selection and synchronization circuit 228 and a walk back circuit 230, in accordance with an embodiment of the present disclosure. Embodiments of the walk back circuit 230 will be described in greater detail below with reference to FIG. 4. As will be appreciated, the illustrated embodiment of the timing circuit 202 is merely one example of a timing circuit that may be used in high speed memory systems, such as DDR5 SDRAM. Thus, while six modes of operation may be provided by the illustrated CWL mode selection and synchronization circuit 228, as described above, other embodiments may be utilized.

The timing circuit 202 may receive the system clock signal SCLK that has a clock cycle of tCK. The SCLK is delayed a delay time D1, compared to the clock signal CK. The system clock signal SCLK may include even cycles (e.g., cycle 0, cycle 2, cycle 4, etc.) and odd cycles (e.g., cycle 1, cycle 3, cycle 5, etc.). The timing circuit 202 may include a divider circuit 302. The divider circuit 302 may be a frequency divider that may provide an even system clock signal SCLK_E and an odd system clock signal SCLK_O responsive to the SCLK signal. For example, the divider circuit 302 may divide a frequency of the SCLK signal, thus a frequency of the SCLK_E and the SCLK_O signals is approximately half the frequency of the SCLK signal. The SCLK_E signal may have even cycles of the SCLK signal as positive half cycles and odd cycles of the SCLK signal as negative half cycles. The SCLK_O signal is a complementary signal of the SCLK_E signal and the SCLK_O signal may have odd cycles of the SCLK signal as positive half cycles and even cycles of the SCLK signal as negative half cycles. In other words, a phase difference between the SCLK_E signal and the SCLK_O signal is about 180 degrees. The SCLK_E signal and the SCLK_O signal may have a clock cycle that is equivalent to two clock cycles of the SCLK (=2 tCK).

The timing circuit 202 may include delay circuits 304 and 306 and a selector circuit 308. As appreciated, the delay circuits 304 and 306 may include delay elements and shifters that provide progressively delayed versions of the SCLK_E and SCLK_O signals at their outputs such that the clocking of the ICMD signal remains synchronized with the clock, despite propagation delays in the ICMD signals (e.g., write command signal), as described above and described further below. The timing circuit 202 may also include circuit nodes 310 and 312. The timing circuit 202 may further include an even command timing circuit CTC_E 314 and an odd command timing circuit CTC_O 316 coupled between the circuit nodes 310 and 312. The delay circuit 304 may receive the SCLK_E signal and may further provide a delayed even system clock signal DSCLK_E having a delay D2 relative to the SCLK_E signal. Similarly, the delay circuit 306 may receive the SCLK_O signal and may further provide a delayed odd system clock signal DSCLK_O having a delay D2 relative to the SCLK_O signal. The CTC_E 314 may include a flip-flop circuit (FF) 318 that may latch the ICMD signal on the circuit node 310 responsive to the DSCLK_E signal and may further provide an even internal command signal ICMD_E. The CTC_O 316 may include a flip-flop circuit (FF) 320 that may latch the ICMD signal on the circuit node 310 responsive to the DSCLK_O signal and may further provide an odd internal command signal ICMD$_{13}$ O.

The timing circuit 202 also includes a decoder 322 that receives and decodes the WBTSEL <1:0> signal from the control circuit 218 to provide a T1 mode enable signal T1EN and a T3/T2 mode enable signal T3/T2EN. In one embodiment, a high logic level of the T3/T2EN causes the selector circuit 308 to transfer SCLK_E and SCLK_O respectively to latch circuits 324 and 326, and the low level of the T3/T2EN causes the selector 306 to transfer SCLK_E and SCLK_O respectively to latch circuits 326 and 324.

Additional selector circuits 328 and 330 are provided between FF circuit 318 and latch circuit 324 and between FF circuit 316 and latch circuit 326, respectively. The selector circuits 328 and 330 are each controlled by the T1EN signal. The high level (H) of the T1EN signal causes the selector circuits 328 and 330 to select ICMD, and the low level (L) of the T1EN signal causes the selector circuits 328 and 330 to select the outputs of the FF circuits 318 (i.e., ICMC_E) and 320 (i.e., ICMD_O), respectively.

The timing circuit 202 may perform the three-cycle-operation (3T) responsive to the active T3/T2EN signal (e.g., a logic high level) and may further perform the two-cycle-operation (2T) responsive to the inactive T3/T2EN signal (e.g., a logic low level). In the 3T mode, time adjustment of the CMD signal may use three clock cycles of the SCLK signal in the timing circuit 202. The selector circuit 308 may provide, in the 3T mode, the SCLK_E signal to the CTC_E 314 responsive to the active T3/T2EN signal. The CTC_E 314 includes the latch circuit 324 which is coupled a switch 332. The latch circuit 324 may receive the ICMD_E signal and the SCLK_E signal and may further latch the ICMD_E signal responsive to the SCLK_E signal from the selector circuit 308. The switch 332 may provide an even latched command signal LCMD_E from the latch circuit 324 on the circuit node 312 responsive to the SCLK_E signal from the selector circuit 308. The selector circuit 308 may further provide, in the 3T mode, the SCLK_O signal to the CTC_O 316 responsive to the active T3/T2EN signal. The CTC_O 316 includes the latch circuit 326 which is coupled to a switch 334. The latch circuit 326 may receive the ICMD_O signal and the SCLK_O signal and may further latch the ICMD_O signal responsive to the SCLK_O signal from the selector circuit 308. The switch 334 may provide an odd latched command signal LCMD_O from the latch circuit 326 on the circuit node 312 responsive to the SCLK_O signal from the selector circuit 308. In general, the switches 332 and 334 are configured to open when the respective outputs of the selector circuit 308 are high and configured to close when the respective outputs of the selector circuit 308 are low.

As described above, due to the propagation delays through the routing and logic gates, the ICMD signal is slowed relative to the SCLK signal. Thus, the command signal at the node 312 is a slow latched command signal SLWLCMD. That is, because of the splitting of the SCLK signal to half frequency clock signals through the divider 302 and the delays introduced through the delay circuits 304 and 306, as well as other gates and routing through the CWL mode selection and synchronization circuit 228, the ICMD signal is slowed. For certain devices, the ICMD signal may be delayed so much that the ICMD signal is captured at the DQ SYS 234 on the wrong cycle, due to the high speed of the device. To counteract the effects of the propagation delays and thus, re-synchronize the command signal with the SCLK when the command signal is a write command, the slow latched command signal SLWLCMD is provided to the walk back circuit 230. The walk back circuit will then provide the LCMD signal (synchronized with the high speed SCLK signal) to the DLINE (R/W) 226, as described above with regard to FIG. 2.

Figure 4:
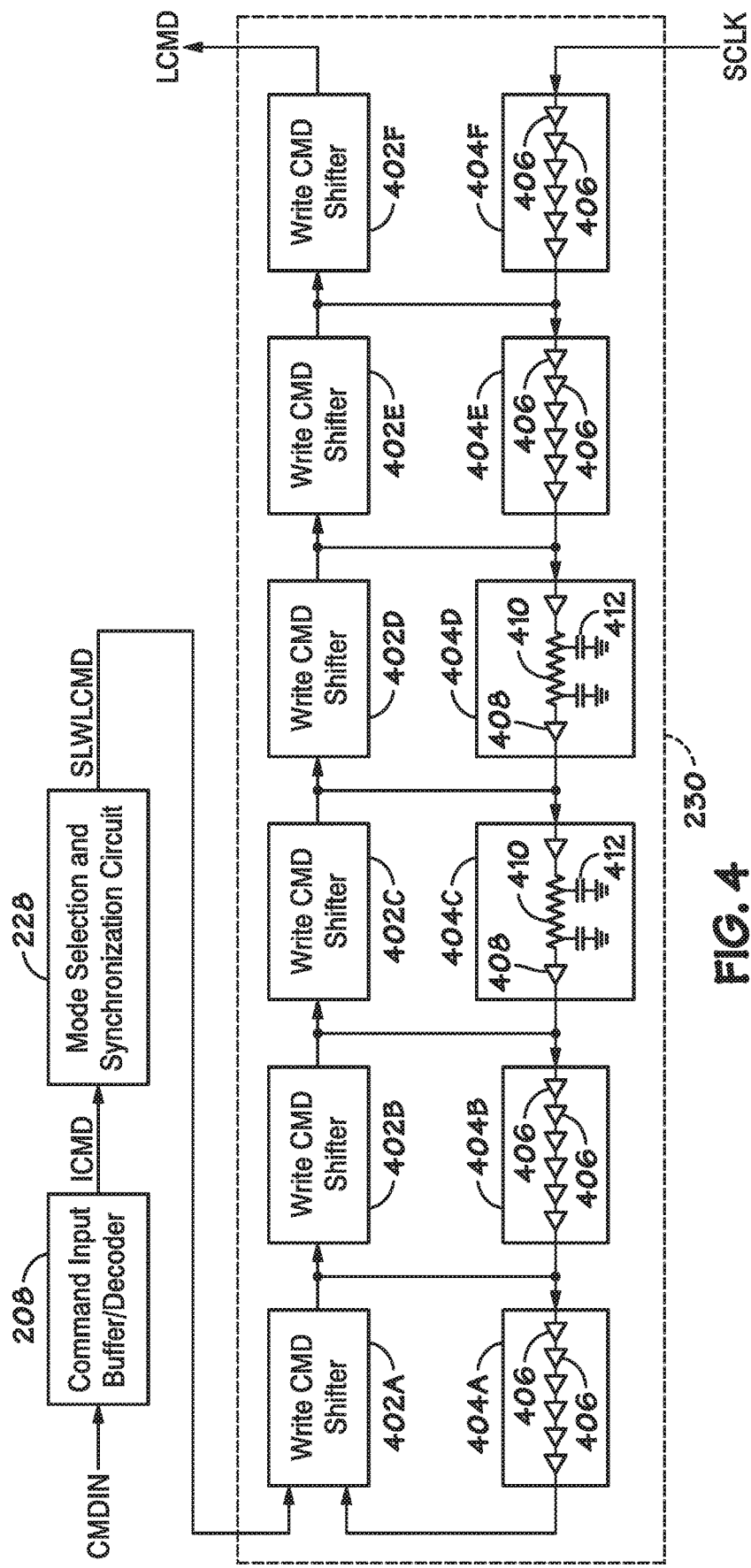
FIG. 4 is a block diagram of a portion of the timing circuit of FIG. 3, including a walk back circuit for increasing the speed of an internal write command signal, such as a write command, in accordance with an embodiment of the present disclosure.

FIG. 4 illustrates an embodiment of the walk back circuit 230. As previously, described, the command input buffer/decoder circuit 208 receives the CMDIN signal and outputs an internal command signal ICMD. The ICMD signal is provided to the CWL mode selection and synchronization circuit 228 of the timing circuit 202. As a result of the propagation delays through the CWL mode selection and synchronization circuit 228, the slow latched command SLWLCMD that is output from the CWL mode selection and synchronization circuit 228 is slower than the ICMD signal and no longer synchronized with the faster SCLK signal. In order to increase the speed of the SLWLCMD, such that command signal is again synchronized with the SCLK signal, the walk back circuit 230 is provided, in accordance with embodiments of the invention. The walk back circuit 230 will produce a latched command LCMD signal that is re-synchronized with the faster SCLK signal.

In the illustrated embodiment, the walk back circuit 230 includes write command shift circuits 402A-402F and delay circuits 404A-404F. In order to re-synchronize the slow latched write command SLWLCMD signal with the fast system clock SCLK signal, the delay circuits 404A-404F are included to mimic the propagation delays experienced by the SCLK signal through the CWL mode selection and synchronization circuit 228, such that they can be accounted for and removed using the write command shift circuits 402A-402F in order to counter the shifting of the write command signal and increase the speed of the SLWLCMD signal by an amount approximately equal to the propagation delays through the CWL mode selection and synchronization circuit 228.

In the illustrated embodiment, the SCLK signal is provided to the chain of delay circuits 404A-404F. The delay circuits 404A-404F are provided to approximately mirror the delays through the CWL mode selection and synchronization circuit 228. Certain delay circuits (e.g., 404A, 404B, 404E and 404F) include a string of logic gate elements 406. The delay circuits that include only logic gate elements 406 are provided to correspond with the delays through the delay circuits 304 and 306, for instance, and are referred to herein as "logic gate delay circuits." The logic gate delay circuits (i.e., those delay circuits that include only logic gate elements 406) approximate the propagation delays through the actual logic gates in the CWL mode selection and synchronization circuit 228. However, because the routing through the CWL mode selection and synchronization circuit 228 also provides additional delays due to PVT variation, "mixed element delay circuits" may also be provided in the delay chain of the walk back circuit 230. For instance, mixed element delay circuits (e.g., 404C and 404D) may include a combination of logic gate elements 408, resistors 410 and capacitors 412. The RC elements of the mixed element delay circuits (e.g., 404C and 404D) provide a more accurate approximation of the delays caused by PVT variation through the routing of the CWL mode selection and synchronization circuit 228.

As will be appreciated, each delay circuit 404A-404F is coupled to a corresponding write command shift circuit 402A-402F that is configured to shift (i.e., speed up) the input signal, an amount coincident with the corresponding delay circuits 404A-404F. In this way, the SLWCMD signal may be sped up by the same amount in which it was slowed responsive to the propagation delays through the CWL mode selection and synchronization circuit 228. Because the chain of delay circuits 404A-404F includes both logic gate delay circuits (e.g., 404A, 404B, 404E and 404F) and mixed element delay circuits (e.g., 404C and 404D), the actual internal parasitic delays due to both logic and routing in the CWL mode selection and synchronization circuit 228 can be more accurately approximated and counteracted through the write back circuit 230, such that the output of the write back circuit 230 is a latched command (LCMD) signal that is synchronized with the fast SCLK signal. As appreciated, by re-synchronizing the ICMD signal with the SCLK during a write command, write data is captured on the correct cycle, even in memory devices with high clock rates, such as DDR5.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus comprising:
   a clock input buffer configured to provide a system clock signal; and
   a timing circuit configured to receive the system clock signal from the clock input buffer and to receive an internal command signal, wherein the timing circuit is configured to output a latched command signal that is synchronized with the system clock signal, and wherein the timing circuit comprises a walk back circuit configured to match propagation delays of the internal command signal through the timing circuit and to increase the speed of the internal command signal such that the latched command signal is synchronized with the system clock signal.

2. The apparatus of claim 1, wherein the internal command signal comprises a write command signal.

3. The apparatus of claim 1, wherein the timing circuit comprises a CWL mode selection and synchronization circuit that receives the system clock signal and produces one or more delayed system clock signals.

4. The apparatus of claim 3, wherein the CWL mode selection and synchronization circuit receives the internal command signal and outputs a slow latched command signal responsive to the one or more delayed system clock signals.

5. The apparatus of claim 4, wherein the walk back circuit is configured to receive the slow latched command signal and to increase the speed of the slow latched command signal to produce the latched command signal.

6. The apparatus of claim 1, wherein the walk back circuit comprises a delay chain configured to receive the system clock signal, wherein the delay chain comprises a plurality of delay circuits configured to match the propagation delays of the internal command signal through the timing circuit.

7. The apparatus of claim 6, wherein a first portion of the plurality of delay circuits comprises logic gate delay circuits, and wherein a second portion of the plurality of delay circuits comprises mixed element delay circuits.

8. The apparatus of claim 7, wherein each of the mixed element delay circuits comprise resistors, capacitors and logic gate elements configured to match delays of the internal command signal through the timing circuit due to routing.

9. The apparatus of claim 6, wherein the walk back circuit comprises a plurality of write command shift circuits configured to increase the speed of the internal command signal through the walk back circuit to output the latched command signal synchronized with the system clock signal.

10. A method comprising:
   providing an internal command signal from a command input buffer/decoder to a timing circuit, responsive to a fast system clock signal;
   reducing a speed of the internal command signal internal to the timing circuit, wherein the speed is reduced by propagation delays attributable to routing and logic gates in the timing circuit; and
   increasing the speed of the internal command signal within the timing circuit to output a latched command signal responsive to the fast system clock signal.

11. The method of claim 10, wherein providing the internal command signal comprises providing a write command signal.

12. The method of claim 10, wherein increasing the speed of the internal command signal comprises mimicking the propagation delays of the timing circuit and increasing the speed of the internal command signal by an amount approximately equal to the propagation delays.

13. The method of claim 10, wherein increasing the speed of the internal command signal comprises increasing the speed utilizing a walk back clock chain.

14. The method of claim 13, wherein the walk back clock chain includes a plurality of logic gate delay circuits and a plurality of mixed element delay circuits.

15. The method of claim 14, wherein each of the plurality of mixed element delay circuits comprises a resistor-capacitor (RC) circuit.

* * * * *